United States Patent
Spanier et al.

(10) Patent No.: US 9,989,618 B2
(45) Date of Patent: Jun. 5, 2018

(54) INTELLIGENT ELECTRONIC DEVICE WITH CONSTANT CALIBRATION CAPABILITIES FOR HIGH ACCURACY MEASUREMENTS

(71) Applicant: Electro Industries/GaugeTech, Westbury, NY (US)

(72) Inventors: Joseph Spanier, Brooklyn, NY (US); Hai Zhu, Westbury, NY (US)

(73) Assignee: ELECTRO INDUSTRIES/GAUGETECH, Westbury, NY (US)

( * ) Notice: Subject to any disclaimer, the term of this patent is extended or adjusted under 35 U.S.C. 154(b) by 1094 days.

(21) Appl. No.: 13/826,345

(22) Filed: Mar. 14, 2013

(65) Prior Publication Data

US 2013/0191053 A1 Jul. 25, 2013

Related U.S. Application Data

(63) Continuation-in-part of application No. 13/479,916, filed on May 24, 2012, now Pat. No. 8,700,347.
(Continued)

(51) Int. Cl.
*G01R 35/00* (2006.01)
*G01R 22/10* (2006.01)

(52) U.S. Cl.
CPC .......... *G01R 35/005* (2013.01); *G01R 22/10* (2013.01)

(58) Field of Classification Search
CPC .............................. G01R 22/10; G01R 35/005
See application file for complete search history.

(56) References Cited

U.S. PATENT DOCUMENTS 2,435,753 A   2/1948   Elliot et al.
2,606,943 A   8/1952   Barker
(Continued)

FOREIGN PATENT DOCUMENTS

JP   08247783      9/1996
WO   WO9854583    12/1998
WO   WO01055733   8/2001

OTHER PUBLICATIONS

Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.
(Continued)

*Primary Examiner* — Janet Suglo
(74) *Attorney, Agent, or Firm* — Gerald E. Hespos; Michael J. Porco; Matthew T. Hespos (57) ABSTRACT

An intelligent electronic device with constant calibration capabilities for high accuracy measurements and method thereof are provided. The intelligent electronic device presented herein constantly samples the output of at least one signal from a sensor and at least three reference signals, where the reference signals include a high reference signal, a low reference signal, and a medium reference signal. Using the constant calibration implementations provided, the intelligent electronic device can calibrate and compensate a signal from a sensor in real time. The constant calibration implementations provided are independent of time and temperature, and are advantageous in a rapidly changing environment. Furthermore, the constant calibration implementations provided enable the intelligent electronic device to track changes in an applied correction factor for traceability in the error correction process. The intelligent electronic device can determine, when the correction (Continued)

factor is applied, how often, and temporary drifts in accuracy.

28 Claims, 4 Drawing Sheets

Related U.S. Application Data which is a continuation of application No. 12/075,690, filed on Mar. 13, 2008, now Pat. No. 8,190,381, application No. 13/826,345, filed on Mar. 14, 2013, which is a continuation-in-part of application No. 13/447,346, filed on Apr. 16, 2012, now Pat. No. 8,862,435, which is a continuation of application No. 12/080,479, filed on Apr. 3, 2008, now Pat. No. 8,160,824.

(60) Provisional application No. 61/694,334, filed on Aug. 29, 2012, provisional application No. 60/921,651, filed on Apr. 3, 2007.

(56) References Cited

U.S. PATENT DOCUMENTS

| | | |
|---|---|---|
| 2,883,255 A | 4/1959 | Anderson |
| 2,900,605 A | 8/1959 | Squires et al. |
| 2,987,704 A | 6/1961 | Gilbert et al. |
| 2,992,365 A | 7/1961 | Brill |
| 3,084,863 A | 4/1963 | Du |
| 3,142,820 A | 7/1964 | Gilbert |
| 3,166,726 A | 1/1965 | Jensen et al. |
| 3,205,439 A | 9/1965 | Michael et al. |
| 3,333,194 A | 7/1967 | Reynolds |
| 3,453,540 A | 7/1969 | Dusheck |
| 3,458,810 A | 7/1969 | Wald |
| 3,467,864 A | 9/1969 | Vander Plaats |
| 3,504,164 A | 3/1970 | Farrell et al. |
| 3,534,247 A | 10/1970 | Miljanic |
| 3,535,637 A | 10/1970 | Goransson |
| 3,629,852 A | 12/1971 | Thexton et al. |
| 3,737,891 A | 6/1973 | Metcalf |
| 3,815,013 A | 6/1974 | Milkovic |
| 3,824,441 A | 7/1974 | Friedman et al. |
| 3,995,210 A | 11/1976 | Milkovic |
| 4,066,960 A | 1/1978 | Milkovic |
| 4,077,061 A | 2/1978 | Johnston et al. |
| 4,140,952 A | 2/1979 | Miller |
| 4,158,810 A | 6/1979 | Leskovar |
| 4,182,983 A | 1/1980 | Heinrich et al. |
| 4,215,697 A | 8/1980 | Demetrescu |
| 4,240,149 A | 12/1980 | Fletcher et al. |
| 4,246,623 A | 1/1981 | Sun |
| 4,255,707 A | 3/1981 | Miller |
| 4,283,772 A | 8/1981 | Johnston |
| 4,345,311 A | 8/1982 | Fielden |
| 4,360,879 A | 11/1982 | Cameron |
| 4,415,896 A | 11/1983 | Allgood |
| 4,437,059 A | 3/1984 | Hauptmann |
| 4,442,492 A | 4/1984 | Karlsson et al. |
| 4,463,311 A | 7/1984 | Kobayashi |
| 4,466,071 A | 8/1984 | Russell |
| 4,486,707 A | 12/1984 | Randall et al. |
| 4,495,463 A | 1/1985 | Milkovic |
| 4,608,533 A | 8/1986 | Starkie |
| 4,689,752 A | 8/1987 | Fernandes et al. |
| 4,709,339 A | 11/1987 | Fernandes |
| 4,713,608 A | 12/1987 | Catiller et al. |
| 4,713,609 A | 12/1987 | Losapio et al. |
| 4,742,296 A | 5/1988 | Petr et al. |
| 4,799,008 A | 1/1989 | Kannari |
| 4,804,957 A | 2/1989 | Selph et al. |
| 4,839,819 A | 6/1989 | Begin et al. |
| 4,841,236 A | 6/1989 | Miljanic et al. |
| 4,843,311 A | 6/1989 | Rozman et al. |
| 4,884,021 A | 11/1989 | Hammond et al. |
| 4,902,965 A | 2/1990 | Bodrug et al. |
| 4,933,633 A | 6/1990 | Allgood |
| 4,949,029 A | 8/1990 | Cooper et al. |
| 4,958,294 A | 9/1990 | Herscher et al. |
| 4,958,640 A | 9/1990 | Logan |
| 4,979,122 A | 12/1990 | Davis et al. |
| 4,989,155 A | 1/1991 | Begin et al. |
| 4,996,646 A | 2/1991 | Farrington |
| 4,999,572 A | 3/1991 | Bickford et al. |
| 5,006,790 A | 4/1991 | Beverly et al. |
| 5,006,846 A | 4/1991 | Granville et al. |
| 5,014,229 A | 5/1991 | McEachern |
| 5,017,860 A | 5/1991 | Germer et al. |
| 5,079,715 A | 1/1992 | Venkataraman et al. |
| 5,122,735 A | 6/1992 | Porter et al. |
| 5,132,609 A | 7/1992 | Nguyen |
| 5,132,610 A | 7/1992 | Ying-Chang |
| 5,166,887 A | 11/1992 | Farrington et al. |
| 5,170,115 A | 12/1992 | Kashiwabara et al. |
| 5,170,360 A | 12/1992 | Porter et al. |
| 5,185,705 A | 2/1993 | Farrington |
| 5,212,441 A | 5/1993 | McEachern et al. |
| 5,220,495 A | 6/1993 | Zulaski |
| 5,224,054 A | 6/1993 | Wallis |
| 5,229,713 A | 7/1993 | Bullock et al. |
| 5,233,538 A | 8/1993 | Wallis |
| 5,237,511 A | 8/1993 | Caird et al. |
| 5,243,536 A | 9/1993 | Bradford |
| 5,245,275 A | 9/1993 | Germer et al. |
| 5,248,935 A | 9/1993 | Sakoyama et al. |
| 5,248,967 A | 9/1993 | Daneshfar |
| 5,258,704 A | 11/1993 | Germer et al. |
| 5,289,115 A | 2/1994 | Germer et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,121 A | 4/1994 | Garverick et al. |
| 5,302,890 A | 4/1994 | McEachern et al. |
| 5,307,009 A | 4/1994 | McEachern et al. |
| 5,315,527 A | 5/1994 | Beckwith |
| 5,343,143 A | 8/1994 | Voisine et al. |
| 5,347,464 A | 9/1994 | McEachern et al. |
| 5,391,983 A | 2/1995 | Lusignan et al. |
| 5,402,148 A | 3/1995 | Post et al. |
| 5,406,495 A | 4/1995 | Hill |
| 5,438,257 A | 8/1995 | Berkcan |
| 5,442,279 A | 8/1995 | Kitayoshi et al. |
| 5,450,007 A | 9/1995 | Payne |
| 5,453,697 A | 9/1995 | Schweer et al. |
| 5,459,395 A | 10/1995 | Berkcan |
| 5,459,459 A | 10/1995 | Lee |
| 5,475,628 A | 12/1995 | Adams et al. |
| 5,514,958 A | 5/1996 | Germer |
| 5,528,507 A | 6/1996 | McNamara et al. |
| 5,537,340 A | 7/1996 | Gawlik |
| 5,544,064 A | 8/1996 | Beckwith |
| 5,548,527 A | 8/1996 | Hemminger et al. |
| 5,555,508 A | 9/1996 | Munday et al. |
| 5,559,719 A | 9/1996 | Johnson et al. |
| 5,563,506 A | 10/1996 | Fielden et al. |
| 5,568,047 A | 10/1996 | Staver et al. |
| 5,574,654 A | 11/1996 | Bingham et al. |
| 5,581,173 A | 12/1996 | Yalla et al. |
| 5,592,165 A | 1/1997 | Jackson et al. |
| 5,606,510 A | 2/1997 | Glaser et al. |
| 5,619,142 A | 4/1997 | Schweer et al. |
| 5,627,759 A | 5/1997 | Bearden et al. |
| 5,642,300 A | 6/1997 | Gubisch et al. |
| 5,650,936 A | 7/1997 | Loucks et al. |
| 5,706,204 A | 1/1998 | Cox et al. |
| 5,706,214 A | 1/1998 | Putt et al. |
| 5,734,571 A | 3/1998 | Pilz et al. |
| 5,736,847 A | 4/1998 | Van Doorn et al. |
| 5,737,231 A | 4/1998 | Pyle et al. |

(56) References Cited

U.S. PATENT DOCUMENTS

| | | |
|---|---|---|
| 5,757,357 A | 5/1998 | Grande et al. |
| 5,764,523 A | 6/1998 | Yoshinaga et al. |
| 5,768,632 A | 6/1998 | Husted et al. |
| 5,774,366 A | 6/1998 | Beckwith |
| 5,801,643 A | 9/1998 | Williams et al. |
| 5,819,203 A | 10/1998 | Moore et al. |
| 5,822,165 A | 10/1998 | Moran |
| 5,828,576 A | 10/1998 | Loucks et al. |
| 5,832,210 A | 11/1998 | Akiyama et al. |
| 5,862,391 A | 1/1999 | Salas et al. |
| 5,874,903 A | 2/1999 | Shuey et al. |
| 5,896,547 A | 4/1999 | Lee |
| 5,897,607 A | 4/1999 | Jenney et al. |
| 5,898,387 A | 4/1999 | Davis et al. |
| 5,899,960 A | 5/1999 | Moore et al. |
| 5,907,238 A | 5/1999 | Owerko et al. |
| 5,933,029 A | 8/1999 | Kuroda et al. |
| 5,952,819 A | 9/1999 | Berkcan et al. |
| 5,963,734 A | 10/1999 | Ackerman et al. |
| 5,986,574 A | 11/1999 | Colton |
| 5,994,892 A | 11/1999 | Turino et al. |
| 5,995,911 A | 11/1999 | Hart |
| 6,018,690 A | 1/2000 | Saito et al. |
| 6,018,700 A | 1/2000 | Edel |
| 6,023,160 A | 2/2000 | Coburn |
| 6,032,109 A | 2/2000 | Ritmiller |
| 6,038,516 A | 3/2000 | Alexander et al. |
| 6,064,192 A | 5/2000 | Redmyer |
| 6,073,169 A | 6/2000 | Shuey et al. |
| 6,098,175 A | 8/2000 | Lee |
| 6,100,817 A | 8/2000 | Mason et al. |
| 6,112,136 A | 8/2000 | Paul et al. |
| 6,133,720 A | 10/2000 | Elmore |
| 6,157,329 A | 12/2000 | Lee et al. |
| 6,163,243 A | 12/2000 | Titus |
| 6,167,329 A | 12/2000 | Engel et al. |
| 6,185,508 B1 | 2/2001 | Van Doom et al. |
| 6,186,842 B1 | 2/2001 | Hirschbold et al. |
| 6,195,614 B1 | 2/2001 | Kochan |
| 6,262,672 B1 | 7/2001 | Brooksby et al. |
| 6,269,316 B1 | 7/2001 | Hubbard |
| 6,289,267 B1 | 9/2001 | Alexander et al. |
| 6,292,717 B1 | 9/2001 | Alexander et al. |
| 6,374,084 B1 | 4/2002 | Fok |
| 6,396,421 B1 | 5/2002 | Bland |
| 6,397,155 B1 | 5/2002 | Przydatek et al. |
| 6,401,054 B1 | 6/2002 | Andersen |
| 6,415,244 B1 | 7/2002 | Dickens et al. |
| 6,417,661 B1 | 7/2002 | Berkcan et al. |
| 6,423,960 B1 | 7/2002 | Engelhardt et al. |
| 6,429,637 B1 | 8/2002 | Gandhi |
| 6,433,981 B1 | 8/2002 | Fletcher et al. |
| 6,444,971 B1 | 9/2002 | Engelhardt et al. |
| 6,479,976 B1 | 11/2002 | Edel |
| 6,483,291 B1 | 11/2002 | Bhateja et al. |
| 6,493,644 B1 | 12/2002 | Jonker et al. |
| 6,509,850 B1 | 1/2003 | Bland |
| 6,519,537 B1 | 2/2003 | Yang |
| 6,522,517 B1 | 2/2003 | Edel |
| 6,528,957 B1 | 3/2003 | Luchaco |
| 6,590,380 B2 | 7/2003 | Edel |
| 6,611,773 B2 | 8/2003 | Przydatek et al. |
| 6,615,147 B1 | 9/2003 | Jonker et al. |
| 6,636,030 B1 | 10/2003 | Rose et al. |
| 6,657,552 B2 | 12/2003 | Belski et al. |
| 6,661,357 B2 | 12/2003 | Bland |
| 6,671,635 B1 | 12/2003 | Forth et al. |
| 6,671,654 B1 | 12/2003 | Forth et al. |
| 6,671,802 B1 | 12/2003 | Ott |
| 6,674,379 B1 | 1/2004 | Li et al. |
| 6,687,627 B1 | 2/2004 | Gunn et al. |
| 6,694,270 B2 | 2/2004 | Hart |
| 6,714,881 B2 | 3/2004 | Carlson et al. |
| 6,717,394 B2 | 4/2004 | Elms |
| 6,735,535 B1 * | 5/2004 | Kagan .................. G01R 21/133 324/142 |
| 6,745,138 B2 | 6/2004 | Przydatek et al. |
| 6,751,563 B2 | 6/2004 | Spanier et al. |
| 6,757,628 B1 | 6/2004 | Anderson et al. |
| 6,759,837 B2 | 7/2004 | Gandhi |
| 6,792,364 B2 | 9/2004 | Jonker et al. |
| 6,829,267 B2 | 12/2004 | Vaughan et al. |
| 6,836,737 B2 | 12/2004 | Petite et al. |
| 6,842,707 B2 | 1/2005 | Raichle et al. |
| 6,944,555 B2 | 9/2005 | Blackett et al. |
| 6,957,158 B1 | 10/2005 | Hancock et al. |
| 6,961,641 B1 | 11/2005 | Forth et al. |
| 6,963,195 B1 | 11/2005 | Berkcan |
| 6,988,043 B1 | 1/2006 | Randall |
| 7,006,934 B2 | 2/2006 | Jonker et al. |
| 7,010,438 B2 | 3/2006 | Hancock et al. |
| 7,072,779 B2 | 7/2006 | Hancock et al. |
| 7,085,824 B2 | 8/2006 | Forth et al. |
| 7,126,493 B2 | 10/2006 | Junker et al. |
| 7,174,261 B2 | 2/2007 | Gunn et al. |
| 7,191,076 B2 | 3/2007 | Huber et al. |
| 7,239,184 B2 | 7/2007 | Cetrulo et al. |
| 7,243,050 B2 | 7/2007 | Armstrong |
| 7,304,586 B2 | 12/2007 | Wang et al. |
| 7,304,829 B2 | 12/2007 | Nadipuram et al. |
| 7,305,310 B2 | 12/2007 | Slota et al. |
| 7,313,176 B1 | 12/2007 | Groen |
| 7,337,081 B1 | 2/2008 | Kagan |
| 7,342,507 B2 | 3/2008 | Jonker et al. |
| 7,359,809 B2 | 4/2008 | Bruno |
| 7,372,574 B2 | 5/2008 | Sanders et al. |
| 7,436,687 B2 | 10/2008 | Patel |
| 7,444,454 B2 | 10/2008 | Yancey |
| 7,511,468 B2 | 3/2009 | McEachern et al. |
| 7,514,907 B2 | 4/2009 | Rajda et al. |
| 7,554,320 B2 | 6/2009 | Kagan |
| 7,577,542 B2 | 8/2009 | Vacar et al. |
| 7,616,656 B2 | 11/2009 | Wang et al. |
| 7,630,863 B2 | 12/2009 | Zweigle et al. |
| 7,660,682 B2 | 2/2010 | Slota et al. |
| 7,761,910 B2 | 7/2010 | Ransom et al. |
| 7,877,169 B2 | 1/2011 | Slota et al. |
| 7,899,630 B2 | 3/2011 | Kagan |
| 7,916,060 B2 | 3/2011 | Zhu et al. |
| 7,920,976 B2 | 4/2011 | Banhegyesi |
| 7,962,298 B2 | 6/2011 | Przydatek et al. |
| 7,974,713 B2 | 7/2011 | Disch et al. |
| 7,996,171 B2 | 8/2011 | Banhegyesi |
| 7,999,696 B2 | 8/2011 | Wang et al. |
| 8,022,690 B2 | 9/2011 | Kagan |
| 8,063,704 B2 | 11/2011 | Wu et al. |
| 8,073,642 B2 | 12/2011 | Slota et al. |
| 8,078,418 B2 | 12/2011 | Banhegyesi et al. |
| 8,107,491 B2 | 1/2012 | Wang et al. |
| 8,121,801 B2 | 2/2012 | Spanier et al. |
| 8,160,824 B2 | 4/2012 | Spanier et al. |
| 8,190,381 B2 | 5/2012 | Spanier et al. |
| 8,269,482 B2 | 9/2012 | Banhegyesi |
| 8,442,660 B2 | 5/2013 | Kagan |
| 8,515,348 B2 | 8/2013 | Kagan |
| 8,700,347 B2 | 4/2014 | Spanier et al. |
| 8,862,435 B2 | 10/2014 | Spanier et al. |
| 8,930,153 B2 | 1/2015 | Kagan et al. |
| 9,080,894 B2 | 7/2015 | Spanier et al. |
| 2002/0032535 A1 | 3/2002 | Alexander et al. |
| 2002/0129342 A1 | 9/2002 | Kil et al. |
| 2002/0169570 A1 | 11/2002 | Spanier et al. |
| 2002/0180420 A1 | 12/2002 | Lavoie et al. |
| 2003/0014200 A1 | 1/2003 | Jonker et al. |
| 2003/0018982 A1 | 1/2003 | Zeidler et al. |
| 2003/0025620 A1 | 2/2003 | Bland |
| 2003/0076247 A1 | 4/2003 | Bland |
| 2003/0093429 A1 | 5/2003 | Nishikawa et al. |
| 2003/0154471 A1 | 8/2003 | Teachman et al. |
| 2003/0178982 A1 | 9/2003 | Elms |
| 2003/0178985 A1 | 9/2003 | Briese et al. |
| 2003/0187550 A1 | 10/2003 | Wilson et al. |
| 2003/0226058 A1 | 12/2003 | Miller et al. |

(56) References Cited

U.S. PATENT DOCUMENTS

| | | |
|---|---|---|
| 2004/0128260 A1 | 7/2004 | Amedure et al. |
| 2004/0172207 A1 | 9/2004 | Hancock et al. |
| 2004/0177062 A1 | 9/2004 | Urquhart et al. |
| 2004/0183522 A1 | 9/2004 | Gunn et al. |
| 2004/0193329 A1 | 9/2004 | Ransom et al. |
| 2004/0208182 A1 | 10/2004 | Boles et al. |
| 2005/0027464 A1 | 2/2005 | Jonker et al. |
| 2005/0060110 A1 | 3/2005 | Jones et al. |
| 2005/0071106 A1 | 3/2005 | Huber et al. |
| 2005/0093571 A1 | 5/2005 | Suaris et al. |
| 2005/0144437 A1 | 6/2005 | Ransom et al. |
| 2005/0165585 A1 | 7/2005 | Bhateja et al. |
| 2005/0187725 A1 | 8/2005 | Cox |
| 2005/0240362 A1 | 10/2005 | Randall |
| 2005/0273280 A1 | 12/2005 | Cox |
| 2005/0288876 A1 | 12/2005 | Doig et al. |
| 2006/0047787 A1 | 3/2006 | Agarwal et al. |
| 2006/0052958 A1 | 3/2006 | Hancock et al. |
| 2006/0066456 A1 | 3/2006 | Jonker et al. |
| 2006/0083260 A1 | 4/2006 | Wang et al. |
| 2006/0095219 A1 | 5/2006 | Bruno |
| 2006/0145890 A1 | 7/2006 | Junker et al. |
| 2006/0161360 A1 | 7/2006 | Yao et al. |
| 2006/0267560 A1 | 11/2006 | Rajda et al. |
| 2007/0058634 A1 | 3/2007 | Gupta et al. |
| 2007/0067119 A1 | 3/2007 | Loewen et al. |
| 2007/0067121 A1 | 3/2007 | Przydatek et al. |
| 2007/0081597 A1 | 4/2007 | Disch et al. |
| 2007/0096765 A1 | 5/2007 | Kagan |
| 2007/0096942 A1 | 5/2007 | Kagan et al. |
| 2007/0112446 A1 | 5/2007 | Deveaux et al. |
| 2007/0114987 A1 | 5/2007 | Kagan |
| 2008/0075194 A1 | 3/2008 | Ravi et al. |
| 2008/0086222 A1 | 4/2008 | Kagan |
| 2008/0091770 A1 | 4/2008 | Petras et al. |
| 2008/0147334 A1 | 6/2008 | Kagan |
| 2008/0172192 A1 | 7/2008 | Banhegyesi |
| 2008/0215264 A1 | 9/2008 | Spanier et al. |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0252481 A1 | 10/2008 | Vacar et al. |
| 2009/0012728 A1 | 1/2009 | Spanier et al. |
| 2009/0072813 A1 | 3/2009 | Banhegyesi |
| 2009/0096654 A1 | 4/2009 | Zhu |
| 2009/0228224 A1 | 9/2009 | Spanier et al. |
| 2009/0265124 A1 | 10/2009 | Kagan |
| 2010/0054276 A1 | 3/2010 | Wang et al. |
| 2010/0153036 A1 | 6/2010 | Elwarry et al. |
| 2010/0169876 A1 | 7/2010 | Mann |
| 2010/0324845 A1 | 12/2010 | Spanier et al. |
| 2011/0040809 A1 | 2/2011 | Spanier et al. |
| 2011/0158244 A1 | 6/2011 | Long et al. |
| 2011/0260710 A1 | 10/2011 | Zhu et al. |
| 2011/0270551 A1 | 11/2011 | Kagan et al. |
| 2013/0158918 A1 | 6/2013 | Spanier et al. |
| 2014/0222357 A1 | 8/2014 | Spanier et al. |

OTHER PUBLICATIONS

User's Installation & Operation and User's Programming Manual. The Futura Series, Electro Industries, pp. 1-64, Copyright 1995.
"Power Quality—A guide to voltage fluctuation and light flicker"; BChydro Power Smart, Vancouver, B.C., Canada; Dated Mar. 2005; pp. 1-12.
The Dranetz Field Handbook for Power quality Analysis; Dranetz Technologies Incorporated, Edison, NJ; Copyright 1991; pp. 1-271.
7700 Ion 3-Phase Power Meter, Analyzer and Controller, pp. 1-8, Nov. 30, 2000.
European Standard EN-50160; "Voltage characteristics of electricity supplied by public distribution networks"; Copyright 2007 CENELEC; published Oct. 31, 2007; pp. 1-23.
Futura+Series, "Advanced Power Monitoring and Analysis for the 21st Century", Electro Industries/Gauge Tech, specification, 8 pages, Apr. 13, 2000.
IEC 61000-4-15: Electromagnetic compatibility (EMC) Part 4: Testing and measuring techniques, Section 15: Flickermeter-Functional and design specifications; CENELEC-European Committee for Electrotechnical Standardization; Apr. 1998.
PowerLogic Series 4000 Circuit Monitors, pp. 1-4; Document #3020HO0601; Jan. 2006.
IEEE Std 1159-1995; IEEE Recommended Practice for monitoring Electric Power Quality; Copyright the Institute of Electrical and Electronics Engineers, Inc. 1995; New York, NY; pp. 1-76.
IEEE Std 519-1992; IEEE Recommended Practices and Requirements for Harmonic Control in Electrical Power Systems; Copyright the Institute of Electrical and Electronics Engineers, Inc. 1993; New York, NY; pp. 1-101.
International Standard IEC-1180-1; "High-voltage test techniques for low-voltage equipment"; Copyright Commission Electrotechnique Commission 1992; Geneva, Switzerland; pp. 1-62.
International Standard IEC-61000-2-4, Second Edition; "Electromagnetic compatibility (EMC)—Part 2-4: EnvironnentCompatbility levels in industrial plants for low-frequency conducted distribances"; Copyright Commission Electrotechnique Commission 2002; Geneva, Switzerland; pp. 1-84.
Power Platform PP1 & PP1E TASKCard-Inrush Operator's Manual; Dranetz-BMI, Revision A—Apr. 15, 1997, pp. 231.
International Standard IEC-61000-4-30, First Edition; "Electromagnetic compatibility (EMC)—Part 4-30:Testing and measurement techniques—Power quality measurement methods"; Copyright Commission Electrotechnique Commission 2003; Geneva, Switzerland; pp. 1-98.
Power Platform 4300 Multi-DAQ TASKCard Operator's Manual; Dranetz-BMI, Original Issue—Jul. 2002, pp. 203.
International Standard IEC-61000-4-7, Second Edition; "Electromagnetic compatibility (EMC)—Part 4-7:Testing and measurement techniques"; Copyright Commission Electrotechnique Commission 2002; Geneva, Switzerland; pp. 1-80.
Performance Power Meter & Data Acquisition Node, Electro Industries/Gauge Tech., Nexus 1250 specification, 8 pages, Dec. 14, 2000.
International Standard IEC-687, Second Edition; "Alternating current static watt-hours meters for active energy"; Copyright Commission Electrotechnique Commission 1992; Geneva, Switzerland; pp. 1-36.
ION Technology, 7500 ION 7600 ION High Visibility Energy & Power Quality Compliance Meters, Power Measurement, specification, pp. 1-8, revision date Nov. 30, 2000.
ION Technology, 7500 ION High Visibility 3-Phase Energy & Power Quality Meter, Power Measurement, specification, pp. 1-8, revision date Mar. 21, 2000.
ION7550/ion7650 PowerLogic power-monitoring units, Technical data sheets, Copyright 2006 Schneider Electric.
Nexus 1250 Installation and Operation Manual Revision 1.20, Electro Industries/Gauge Tech, 50 pages, Nov. 8, 2000.
Nexus 1250, Precision Power Meter & Data Acquisition Node, Accumeasure Technology, Electro Industries/Gauge Tech, specification, 16 pages, Nov. 1999.
Series 5500 InfoNode User's Guide; Dranetz-BMI, Edison, NJ; Copywright 1999, 2002, 2004; pp. 1-220.
Electro Industries/Gauge Tech DM Series-specification brochure, "DMMS 425 Low-Cost Multifunction Power Monitoring Outperforms All Others in its Class", 4 pages.
3720 ACM, 3-phase Power Instruction Package, Power Measurement, specification, 8 pages, revision date Dec. 16, 1998.
3720 ACM, Installation & Operation Manual, Power Measurement, 67 pages, revision date Apr. 4, 2000.
6200 ION, Installation & Basic Setup Instructions, (c)Power Measurement Ltd., Revision Date Apr. 25, 2001, 50 pages.
8400 ION/8500 ION Instruction Leaflet, Power Measurement, pp. 1-8, Oct. 1999.
8500 ION Technical Documentation, 8500 ION and 8500 ION-PQ Advanced Intelligent Billing Meters, specification, Power Measurement, revision date Apr. 15, 1999.

(56) References Cited

OTHER PUBLICATIONS

Brochure, Sentinel TM Electronic "Multimeasurement Meter," Schlumberger, Mar. 2001, 4 pages.
Communicator EXT 3.0, User Manual Version 1.28; Electro Industries/Gauge Tech; Doc # E107707 V1.28, Nov. 11, 2005.
http://www.landisgyrus/Landis-Gyr/Meters/2510-socket-meter.asp, Apr. 18, 2005, 25 pages.
ION 7550/ION7650 User Guide Power Measuremen-Revision Date Aug. 31, 2004.
ION Technology 7700 ION 3-Phase Power Meter, Analyzer and Controller, Power Measurement, specification, pp. 1-10, revision date Dec. 8, 1998.
ION Technology 7700 ION Installation & Operation Manual, Power Measurement, revision date Nov. 20, 1996.
Ion Technology 8500 ION. 8400 ION Advanced Socket-Mount Meter, specification, Power Measurement, pp. 1-12, revision date Dec. 3, 1999.
ION(R) Technology, Meter Shop User's Guide, (C)Power Measurement Ltd., Revision DAte May 10, 2001, 48 pages.
Manual, "3300 ACM, Economical Digital Power Meter/Transducer—Installation and Operation Manual, Power Measurement, Ltd.", 1999, pp. 79.
Nagura et al., "Correction method for a single chip power meter", May 10-12, 1994, IEEE, 1994 IEEE Instrumentation and Measurement Technology Conference, 1994. ITMC/94.
Ramboz, J.D. And Petersons, O., Nist Measurement Services: A Calibration Service for Current Transformers, U.S. Dept. of Commerce, National Institute of Standards and Tech., U.S. Gov. PMtg. Ofc., Jun. 1991.

\* cited by examiner

INTELLIGENT ELECTRONIC DEVICE WITH CONSTANT CALIBRATION CAPABILITIES FOR HIGH ACCURACY MEASUREMENTS

PRIORITY

This application claims priority to U.S. Provisional Application Ser. No. 61/694,334, filed Aug. 29, 2012, the contents of which are hereby incorporated by reference in its entirety.

This application is also a continuation-in-part application of U.S. patent application Ser. No. 13/479,916 filed on May 24, 2012, which is a continuation application of U.S. patent application Ser. No. 12/075,690 filed on Mar. 13, 2008, now U.S. Pat. No. 8,190,381, which claims priority to U.S. Provisional Patent Application Ser. No. 60/921,651 filed Apr. 3, 2007, the contents of all of which are hereby incorporated by reference in their entireties.

This application is also a continuation-in-part application of U.S. patent application Ser. No. 13/447,346 filed on Apr. 16, 2012, which is a continuation application of U.S. patent application Ser. No. 12/080,479 filed on Apr. 3, 2008, now U.S. Pat. No. 8,160,824, which claims priority to U.S. Provisional Patent Application Ser. No. 60/921,651 filed Apr. 3, 2007, the contents of all of which are hereby incorporated by reference in their entireties.

BACKGROUND

Field

The present disclosure relates generally to intelligent electronic devices (IEDs) and, in particular, to intelligent electronic devices with constant calibration capabilities for high accuracy measurements.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be intelligent electronic devices ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IED's may be positioned along the supplier's distribution path or within a customer's internal distribution system. IED's include revenue electric watt-hour meters, protection relays, programmable logic controllers, remote terminal units, fault recorders and other devices used to monitor and/or control electrical power distribution and consumption. IED's are widely available that make use of memory and microprocessors to provide increased versatility and additional functionality. Such functionality includes the ability to communicate with remote computing systems, either via a direct connection, e.g. modem or via a network. IED's also include legacy mechanical or electromechanical devices that have been retrofitted with appropriate hardware and/or software allowing integration with the power management system.

Typically an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

SUMMARY

In accordance with embodiments of the present disclosure, an intelligent electronic device (IED) with constant calibration capabilities for high accuracy measurements and method thereof are provided. The constant calibration implementations of the present disclosure are independent of time and temperature, and are advantageous in a quickly changing environment. Since the calibration process is constantly occurring, there will be traceability in the error correction process. That is, the meter can track changes in an applied correction factor to determine, for example, when the correction factor is applied, how often, temporary drifts in accuracy, etc. In contrast, prior art methods which only calibrate once a day, cannot isolate when and how often drift in accuracy occurs. Furthermore, the implementations of the present disclosure do not stop sampling meter readings simply to take calibration readings, and therefore, the IED does not lose any data and the metering readings are stable.

According to one aspect of the present disclosure, an intelligent electronic device includes at least one sensor configured to measure at least one parameter of an electrical distribution system and output a signal indicative of the measured at least one parameter; a reference source configured to provide at least three reference voltage signals, each of the at least three reference signals having a different predetermined value; at least one switch configured to receive the output signal of the at least one sensor and the at least three reference voltage signals and to selectively output the received signals; at least one analog-to-digital converter configured to receive the switched signals and convert the switched signals to digital signals; and at least one processing device configured to calibrate the output signal of the at least one sensor based on the at least three reference voltage signals, wherein the at least one switch is configured to sequentially sample one sample from each of the output signal of the at least one sensor and the at least three reference voltage signals continuously during a normal operating mode.

According to another aspect of the present disclosure, an intelligent electronic device includes at least one sensor configured to measure at least one parameter of an electrical distribution system and output a signal indicative of the measured at least one parameter; a reference source configured to provide at least three reference voltage signals, each of the at least three reference signals having a different predetermined value; at least one analog-to-digital converter including a plurality of channels to receive along a separate channel each of the at least one sensor and the at least three reference signals; and at least one processing device configured to calibrate the output signal of the at least one sensor based on the at least three reference voltage signals, wherein the at least one analog-to-digital converter samples each separate channel receiving the at least one sensor and the at least three reference signals substantially simultaneously.

BRIEF DESCRIPTION OF THE DRAWINGS

These and other objects, features and advantages of the present disclosure will be apparent from a consideration of the following Detailed Description considered in conjunction with the drawing Figures, in which.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In a preferred embodiment, however, the functions are performed by at least one processor, such as a computer or an electronic data processor, digital signal processor or embedded micro-controller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links. Several inventive embodiments of the present disclosure are described below.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
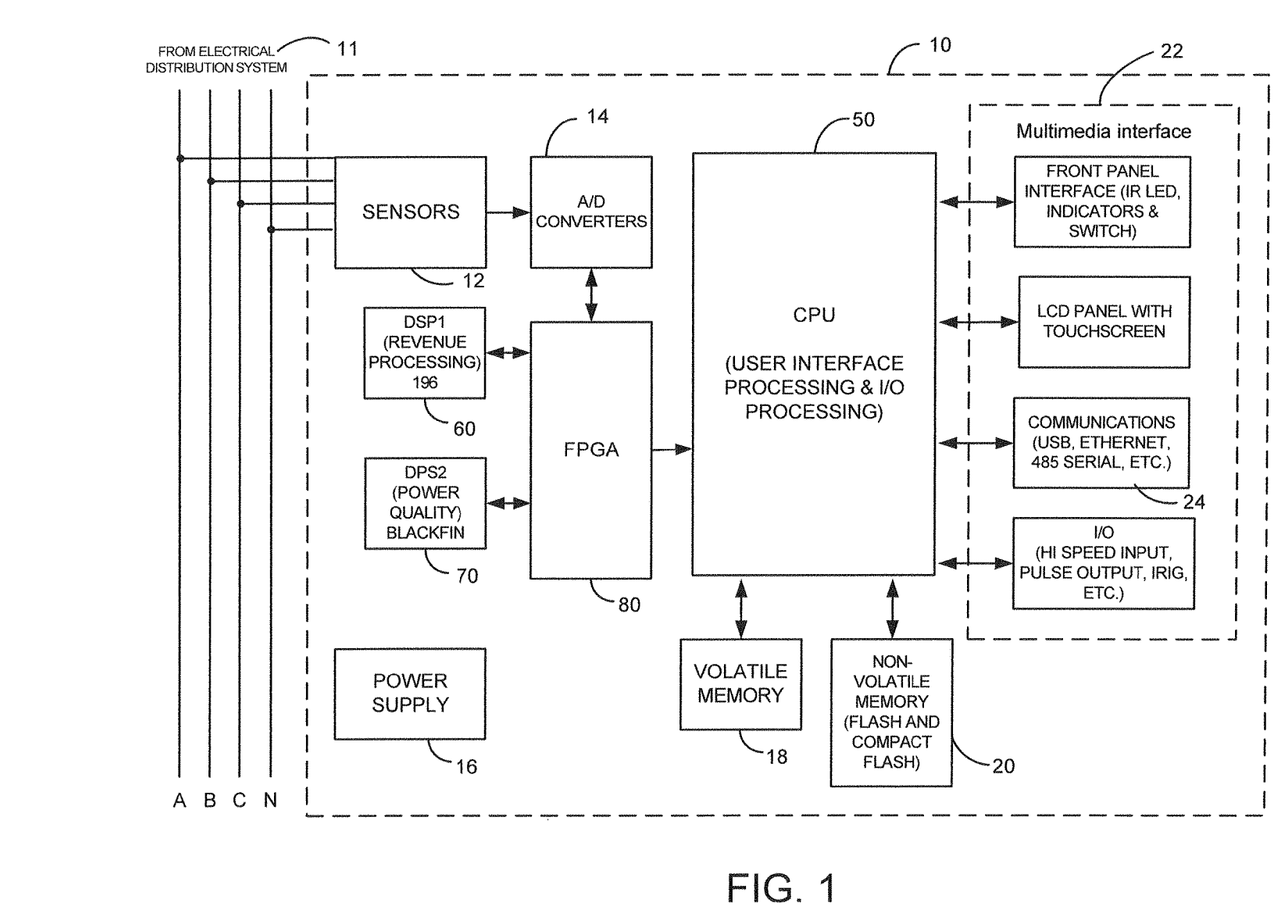
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, an non-volatile memory 20, a multimedia user interface 20, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processor 60. In one embodiment, the FPGA 80 is internally comprised of two dual port memories to facilitate the various functions.

The plurality of sensors 12 sense electrical parameters, e.g., voltage and current, on incoming lines, (i.e., phase A, phase B, phase C, neutral N), from an electrical power distribution system 11. The sensors 12 will sense electrical parameters, e.g., voltage and current, of the incoming lines from an electrical power distribution system 11, e.g., an electrical circuit. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14 are sent directly to the CPU 50 or DSP processors 60, 70, effectively bypassing the FPGA 80 as a communications gateway.

The power supply 16 provides power to each component of the IED 10. Preferably, the power supply 16 is a transformer with its primary windings coupled to the incoming power distribution lines and having windings to provide a nominal voltage, e.g., 5VDC, +12VDC and −12VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 preferably includes a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .mlv, .mp2v .mpeg2), Microsoft Recorded TV Show files (.dvr-ms), Microsoft Windows Video files (.avi) and Microsoft Windows Audio files (.wav).

The IED 10 further comprises a volatile memory 18 and a non-volatile memory 20. In addition to storing audio and/or video files, volatile memory 19 will store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 10 will include a communication device 24, also know as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 10 may communicate to a server or other computing device via a communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Furthermore, it is to be appreciated that the IEDs or meters described herein may take many form factors, such as a panel meter, revenue meters, socket meter, etc. Exemplary housings and form factors are disclosed in commonly owned and co-pending U.S. application Ser. No. 13/792,616, the contents of which are hereby incorporated by reference in its entirety.

The present disclosure further provides devices, circuit and methods for calibrating sensor inputs to ensure high accuracy measurements.

Conventionally, metering hardware has two modes, one is a calibration sampling mode, the other is a regular sampling mode. The hardware and firmware of the meter work together to set the meter in one mode and switch into the other mode as needed, for example, based on a predetermined period of time or temperature variation.

Figure 2:
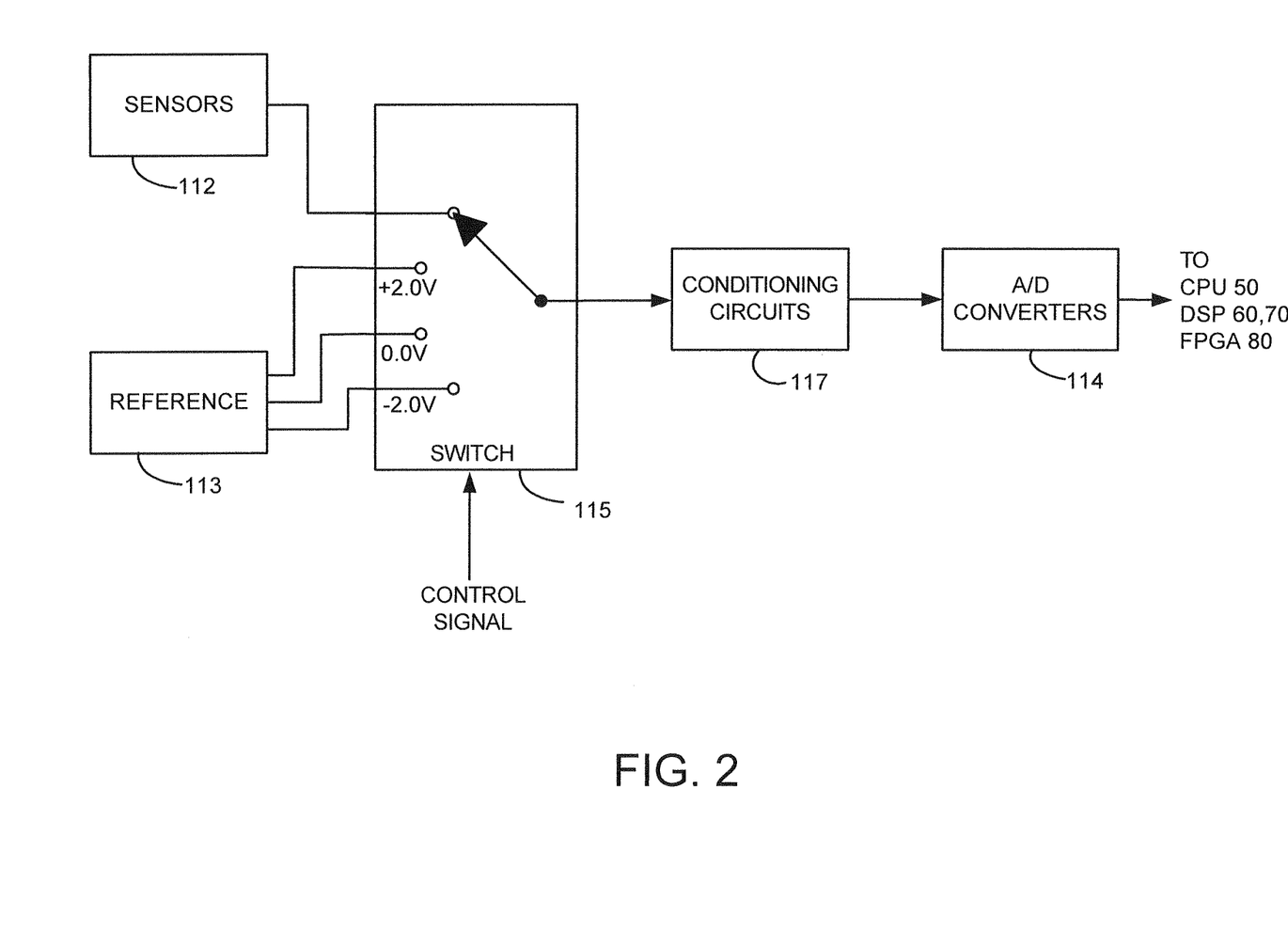
FIG. 2 is a schematic diagram of a circuit for performing constant calibration of measurement sensors in accordance with an embodiment of the present disclosure.

When the meter is in the regular sampling mode, the measured voltage and current inputs, as sensed by sensors 112, go through the conditioning circuits 117 and feed into analog to digital converters (ADC) 114, as illustrated in FIG. 2. Then, digitalized numbers which represent measured voltage and current feed into DSP/FPGA/CPU and other parts of the meter system, as shown in FIG. 1. In the calibration sampling mode, reference signals generated by reference source 113 go through the conditioning circuits 117 and feed into the ADC 114 and then to the other parts of the system, for example, as shown in FIG. 1. At least one switch circuit 115 controlled by firmware/hardware, via a control signal, will select whether measured voltage and current signals or reference signals connect into the conditioning circuits 117.

In various embodiments, the at least one switch 115 may be controlled by either the CPU, FPGA, DSP1 or DSP2, or any combination thereof. It is to be appreciated that a switch or switch circuit is provided for each sensor 112 in the meter, for example, when measuring a three phase system, the meter includes four voltage sensors (i.e., one for each phase and neutral), four current sensors (i.e., one for each phase and neutral) and, therefore, eight switches. In one embodiment, the necessary number of switches may be disposed in a single device or on a single integrated circuit. It is to be further appreciated that other structures may be employed other than switch circuit 115 to switch among the sensor input and reference inputs, e.g., a multiplexer.

The conditioning circuits provide the necessary operation for transfer of sensor outputs into a form adequate for measurement such as ADC inputs. Typical functions of the conditioning circuits includes level shifting, linearization with a certain gain, filtering and impedance matching among others. The reference signals are generated by a very stable reference source 113 located in the meter housing, which has very small drift effects, such as time and temperature. The reference source 113 may be a voltage reference IC chip, which provides a very accurate voltage independent of temperature and the supply voltage. An exemplary reference source chip is a model REF198 from Analog Devices or a model MAX6126 from Maxim Integrated Products, Inc., among others.

The processors of the meter assume the reference signals generated by the reference source 113 will not change, and by tracing the meter's ADC outputs in the calibration sampling mode, the CPU, DPS and/or the FPGA can compensate the meter's ADC outputs in the regular sampling mode. How often the meter switches into the calibration sampling mode will decide the meter reading accuracy's traceability and uncertainty.

It is to be appreciated that the reference source may be either an external discrete component or integrated with another semiconductor component, such as an ADC's build-in reference. The reference may also be used in conjunction with the various components of the device shown in FIG. 1 to, for example, setup DC-bias for at least one amplifier along the conditioning circuits. In another words, the reference source 113 can be shared for multiple purposes.

Although the switch 115 is shown between the sensors 112 and conditioning circuits 117, it is to be appreciated that the switch may be disposed along the analog path in other positions, e.g., after the conditioning circuits 117 before the analog-to-digital converters 114. In one embodiment, the analog-to-digital converters includes a built-in multiplexer (MUX), which may be used to switch signals between regular sensor signals and reference signal.

One conventional method for switching modes is to let the meter stay in the regular sampling mode most of the time, only switching into calibration sampling mode once a day, i.e., based on a predetermined period of time. For example, assume that each day the meter takes 1,000,000 samples, 1000 samples of the total is taken when the meter is in the calibration sampling mode, all of the other samples are taken by the meter in the regular sampling mode.

From the point of real time, there are a couple of approaches for the meter switching between the regular sampling mode and calibration sampling mode. One way is taking 1000 calibration mode samples continuously within a short period of time. In other words, the meter can switch into calibration sampling mode, take 1000 samples, and then switch into regular sampling mode and take 999,000 samples. Another way is that meter switches between calibration sampling mode and regular sampling mode in a much more frequent way, such as the meter switching into calibration mode and taking 1 sample, and then switching into regular sampling mode and taking 999 samples. The meter would repeat this sequence 1000 times and at the end of total 1,000,000 samples, 1000 of the samples are sampled in calibration sampling mode, the rest being sampled in regular sampling mode. Because the meter monitors the calibration source more frequently in the second approach, it would have better accuracy. In another words, the meter can switch into calibration sampling mode, take 1000 samples, and then switch into regular sampling mode and take 999,000 samples, or the meter can switch into calibration sampling mode, take 1 sample, then switch into regular sampling mode, take 999 samples, and repeat it 1000 times to get 1,000,000 samples total.

Because of physical constraints, the switch circuits 115 and conditional circuits 117 require a certain amount of time to let the signal settle down after the meter switches from one mode to the other, otherwise the sensed signal will have a large amount of noise and distortions which leads to poor measurement performance of the meter. Conventional meters which pass high accuracy standards and with calibration capability are designed to perform like this, i.e., the meter stays in regular sampling mode and samples the measured voltage, current input, and switches into calibration sampling mode and takes hundreds or even thousands of samples on the reference signal (the point is more than one), and then switches back into regular sampling mode until it is the next time to go to calibration mode. Because the settling time for switching modes is a fixed number, the meter would be able to get stable ADC outputs by throwing out the first several samples right after the system changed to the sampling mode, but a few drawbacks exist. Firstly, when the meter stays in the calibration mode, the meter has to stop sampling the measured voltage and current, and instead measures the reference signal source. Secondly, since when in calibration mode the sensor inputs are not read, the meter is configured to avoid going into calibration mode as much as possible so the calibration mode is greatly spaced, and therefore, the meter loses the reference signal source's stable traceability, i.e., it loses the ability to closely track changes in the meter characteristics.

The techniques of the present disclosure would not suffer from these two issues and will be described as constant calibration capability.

By selecting a better performance chip, careful PCB board layout and implementing precise timing control by firmware (FPGA or DSP or CPU), the meter can switch between the calibration sampling mode and the regular sampling mode very fast, i.e., constantly. The technique is fast enough to switch at every sample, in other words, the meter takes a sample in the calibration sampling mode and then switches to the regular sampling mode to take a sample, and then repeats these two steps forever, so the meter continuously switches between the two modes for successive samples. In this manner, the measured voltage and current will never be stopped from sampling, at the same time, the reference signal will be sampled all the time also. The compensation to the measured voltage and current is done in real time, not once or twice a day as in conventional meters.

Figure 3:
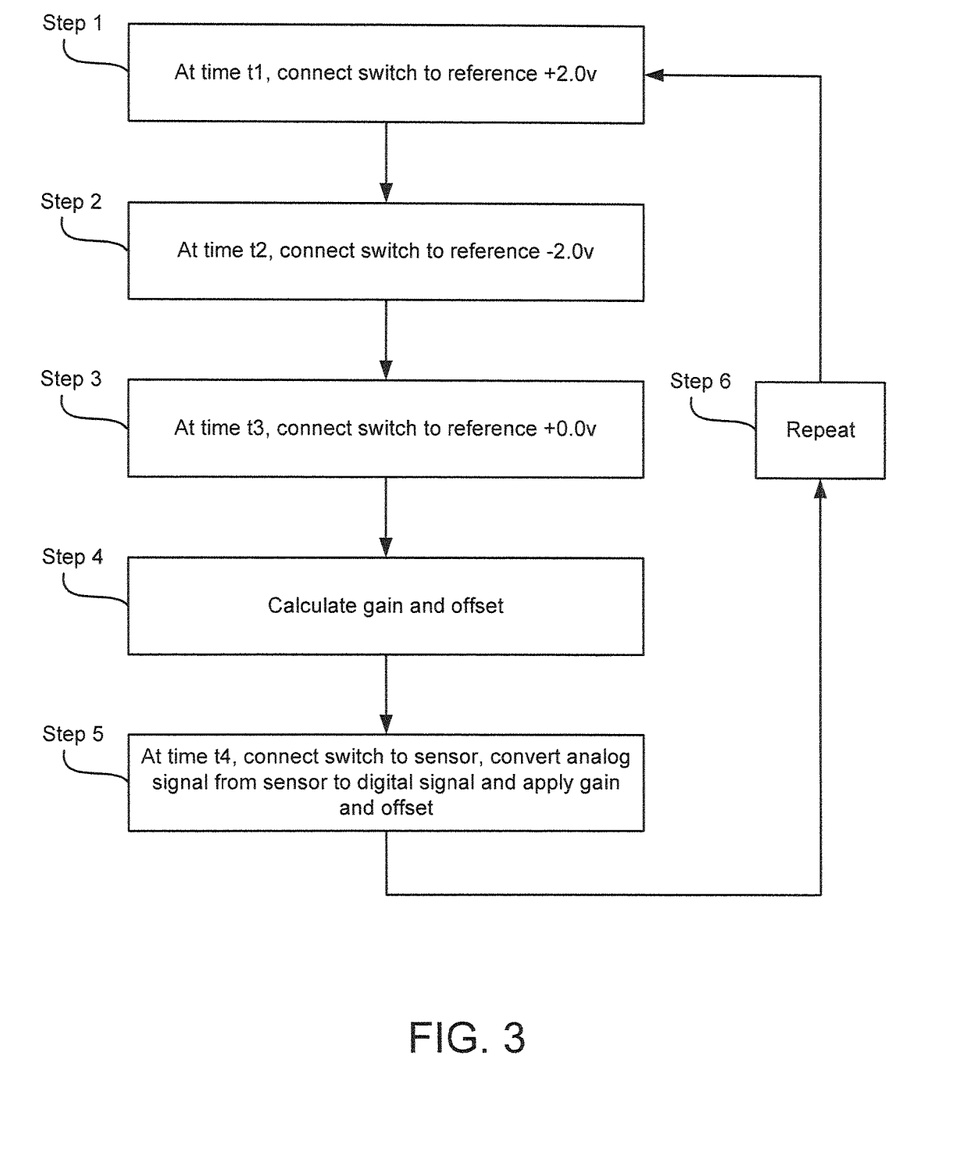
FIG. 3 is a flow chart illustrating a method for performing constant calibration of measurement sensors in accordance with an embodiment of the present disclosure.

Referring to FIG. 3, one exemplary method for constantly calibrating an IED in accordance with the present disclosure is as follows:

Step 1.) at time t1, switch 115 connects to reference +2v, ADC 114 converts analog signal into ADC count St1;

Step 2.) at time t2=t1+td, switch 115 connects to reference −2v, ADC 114 converts analog signal into ADC count St2; where td is the time interval between t2 and t1; and Step 3.) at time t3=t2+td, switch 115 connects to reference 0v, ADC 114 converts analog signal into ADC count St3.

Step 4.) FPGA or CPU or DSP (or any other appropriate processor) then calculates the compensation gain and offset values. For example, at this moment, three ADC count values have been collected, St1 (source is +2.0v), St2 (source is −2.0v) and St3 (source is 0.0v). In the next step, two compensation factors are needed to correct sample counts in regular sampling mode, where the two compensation factors are gain and offset determined as follows:

Offset=St3; this is the formula for offset

Gain=4.0v/(*St*1−*St*2); this is the formula for gain.

Step 5.) at time t4=t3+td, switch 115 connects to the sensor 112, ADC 114 converts analog signal into ADC count St4, using the compensation gain and offset value, the meter calibrates St4 into CSt4, using the following equation:

*CSt*4=gain*(*St*4−offset).

At time t4, the circuits are in the regular sampling mode, where St1, St2 and St3 are sampled in the calibration sampling mode. In one embodiment, the DSP calculates and applies the correction CSt4 to St4, however, in other embodiments, the CPU and/or the FPGA may perform this function.

In one exemplary embodiment, the ADC is taking samples every 16.276 μsec, in another words, every second, the ADC is taking 61440 samples. Every 10 seconds, ADC is taking 614400 samples. The first 6144 samples are taken under the calibration sampling mode and using +2.0v as reference input, this step would last 100 ms, the next 6144 samples are taken under the sampling calibration mode and using −2.0v as reference input, and it last 100 ms, the next 6144 samples are taken under the calibration sampling mode and using 0.0v as reference input, and it last 100 ms. The last 595968 samples would be taken under the regular sampling mode and it would last 9.7 second, after that, everything repeats. Therefore, the meter or IED is constantly calibrated every 10 seconds.

In another exemplary embodiment, the repeat cycle, that is the time between calibration sampling, is configured to be as small as possible. In this case, if ADC is taking samples every 16.276 μsec, then the repeat cycle would be 4×16.276 μsec=65.1 μsec, so every 4 ADC samples would cover ADC samples taken from ref +2.0v, ref −2.0v, ref 0.0v and regular input. This means that sensor data is sampled every 65.1 μsec without any gaps in time, i.e., the sensor data is constantly calibrated.

It is to be appreciated that the sampling rate required to achieve the above calibration method will be 4× the desired sampling rate of the meter, e.g., the desired sampling rate of the analog-to-digital converters 114. That is, to achieve the desired sampling rate for metering operations, the meter must collect 4 times as many samples since every cycle the meter will collect 1 sample for metering operations and 3 samples for calibration. For example , if a sampling rate of 256 samples/cycle is desired, the meter will actually collect 1024 samples/cycle, taking every fourth sample for metering operations to have 256 samples/cycle. The remaining samples will be used for calibration at the respective reference points. Therefore, generally the required sampling rate will be determined as follows:

required sampling rate =desired sampling rate of IED * (1 +number of reference points).

Figure 4:
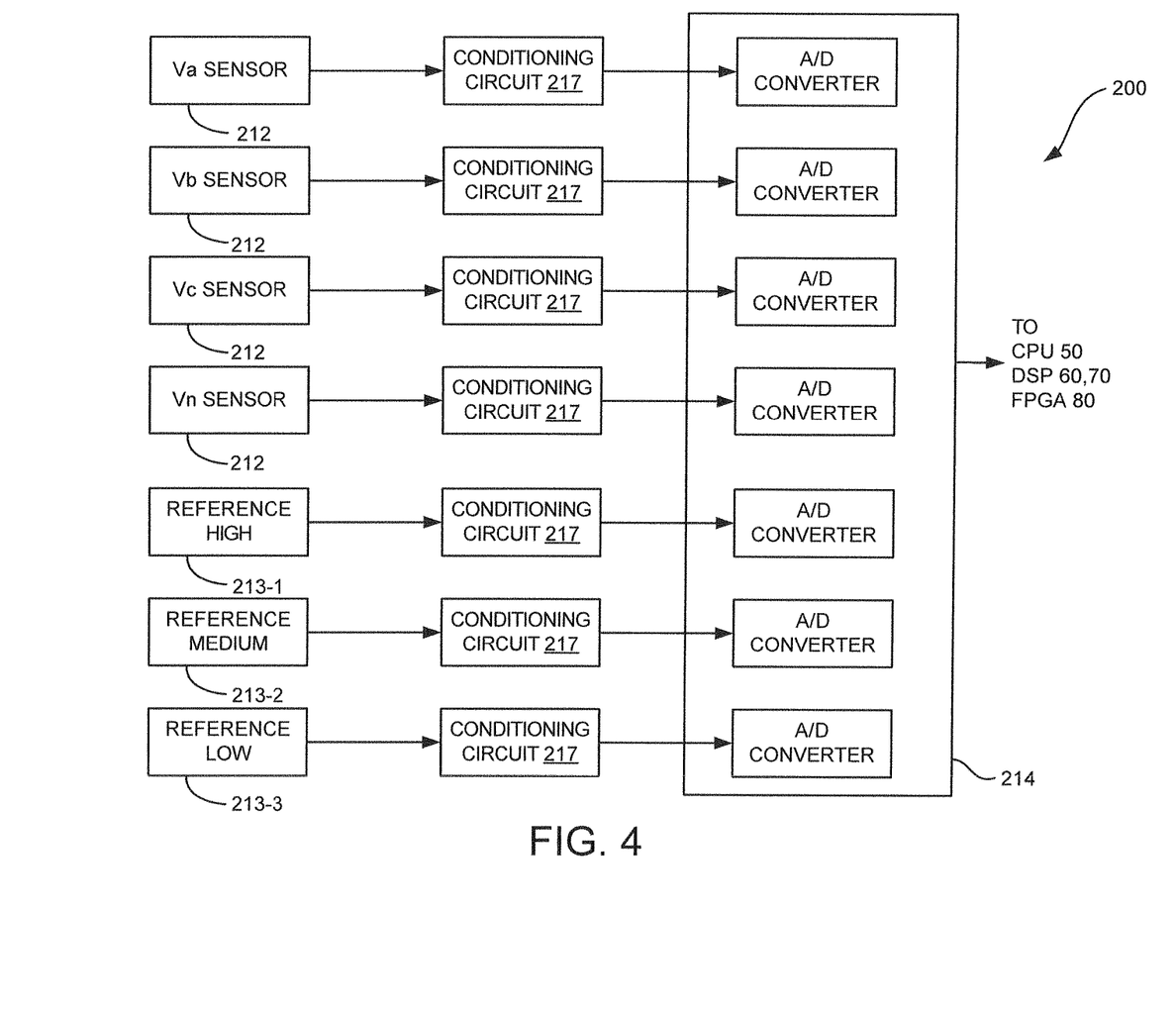
FIG. 4 is a schematic diagram of a circuit for performing constant calibration of measurement sensors in accordance with another embodiment of the present disclosure.

To avoid switching between the regular sample mode and calibration mode, a dedicated analog path and ADC may be provided to monitor each sensor and the reference source all the time. The movement observed from this dedicated reference measurement can be used to compensate the measured sensor signals. Referring to FIG. 4, a calibration circuit that does not require switching is provided. Here, a dedicated analog path is provided for each sensor channel and for each reference point. FIG. 4 illustrates a calibration circuit 200 for the voltage channels of an IED. As is shown in FIG. 4, each voltage sensor 212, e.g., Va, Vb, Vc, Vn, is coupled to a conditioning circuit 217 and an analog-to-digital converter 214. Additionally, a dedicated analog path is provided for each reference point generated, for example, a high reference signal 213-1, a medium reference signal 213-2 and a low reference signal 213-3. It is to be appreciated that the at least three reference signals may be generated from a single reference source or, in another embodiment, each reference signal has a dedicated source.

Each analog path is configured to have substantially the same characteristics. Additionally, the analog-to-digital converters 214 are synchronized to sample all the analog paths substantially simultaneously. In one embodiment, the analog-to-digital converters 214 are disposed in a single device; however, in other embodiments, the analog-to-digital converters may be disposed among several devices configured to receive a common signal from at least one processor, e.g., CPU 50. DSP 60, 70, FPGA 80, to sample simultaneously.

After each sample is sampled, the sampled values from the at least three reference paths are employed to calibrate the values received along the sensor measurement paths according to the formulas above for gain and offset.

It is to be further appreciated that by employing the constant calibration method described the meter will not lose any data since it will not stop sampling simply to take calibration readings and thus the metering readings will be stable. The constant calibration method of the present disclosure is independent of time and temperature, and is advantageous in a quickly changing environment.

Furthermore, since the calibration process is constantly occurring, there will be traceability in the error correction process. That is, the meter can track changes in the applied correction factor to determine, for example, when the correction factor is applied, how often, temporary drifts in accuracy, etc. In contrast, prior art methods which only calibrate once a day, cannot isolate when and how often drift in accuracy occurs.

While preferred embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '________' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An intelligent electronic device (IED) comprising:
at least one sensor configured to measure at least one parameter of an electrical distribution system and output a signal indicative of the measured at least one parameter;
a reference source configured to provide at least three reference voltage signals, each of the at least three reference voltage signals having a different predetermined value;
at least one switch configured to receive the output signal of the at least one sensor and the at least three reference voltage signals and to selectively output the received signals, sequentially and repeatedly;
at least one analog-to-digital converter configured to receive the selectively outputted signals, sequentially sample each of the selectively outputted signals, and convert each sample to a digital sample; and
at least one processing device configured to determine a gain and an offset based on the samples of the at least three reference voltage signals, wherein the offset is a middle value of the at least three reference voltage values and the gain is calculated using the following formula:

gain=(a range of a highest reference signal value to the lowest reference signal value)/(highest measured reference signal value−lowest measured reference signal value), and the at least one processing device is further configured to calibrate each of the samples of the outputted signal of the at least one sensor with the gain and offset based on the samples of the at least three reference voltage signals.

2. The IED of claim 1, further comprising a conditioning circuit coupled to the at least one switch and the at least one analog-to-digital converter, the conditioning circuit configured to receive the selectively outputted signals from the at least one switch and to perform at least one of level shifting, linearization with a predetermined gain, filtering, and impedance matching on the received signals.

3. The IED of claim 1, wherein the reference source is a voltage reference integrated circuit chip.

4. The IED of claim 1, wherein the predetermined values of the at least three reference voltage signals are 2.0 Volts, a 0.0 Volts, and a −2.0 Volts.

5. The IED of claim 1, wherein the at least one processing device calculates each calibrated sample of each sample of the outputted signal of the at least one sensor in each repeat cycle using the following formula:

calibrated sample=gain x (sample of the at least one sensor in the repeat cycle-offset).

6. The IED of claim 1, wherein the at least one parameter is one of voltage and current.

7. The IED of claim 1, wherein the at least one sensor, the reference source, the at least one switch, the at least one analog to digital converter, and the at least one processing device are configured in a socket-type meter form.

8. The IED of claim 1, wherein the at least one sensor, the reference source, the at least one switch, the at least one analog-to-digital converter and the at least one processing device are configured in a panel mounted meter form.

9. The IED of claim 1 wherein the at least one sensor, the reference source, the at least one switch, the at least one analog-to-digital converter and the at least one processing device are configured in a switchboard meter form.

10. The IED of claim 1, wherein the at least one sensor, the reference source, the at least one switch, the at least one analog-to-digital converter and the at least one processing device are configured in a A-base front wired meter form.

11. The IED as in claim 1, wherein the at least one sensor, the reference source, the at least one switch, the at least one analog-to-digital converter and the at least one processing device are configured in a circuit breaker mounted meter form.

12. The IED of claim 1, wherein the at least one analog-to-digital converter is configured to sample the output signals of the at least three reference voltage signals and the at least one output signal of the at least one sensor according to a repeat cycle, the repeat cycle comprising sequentially sampling the output signals of the at least three reference voltage signals each for a first time interval, and then sampling the output signals of the at least one sensor for a second time interval, the second time interval greater than the first time interval.

13. The IED of claim 1, wherein the at least one analog-to-digital converter is configured to sample the output signals of the at least three reference voltage signals and the at least one output signal of the at least one sensor according to a repeat cycle, the repeat cycle comprising sampling the output signals of the at least one sensor and the output signals of the at least three reference signals each for a first time interval.

14. An intelligent electronic device (IED) comprising:
at least one sensor configured to measure at least one parameter of an electrical distribution system and output a signal indicative of the measured at least one parameter;
a reference source configured to provide at least three reference voltage signals, each of the at least three reference voltage signals having a different predetermined value;
at least one switch configured to receive the output signal of the at least one sensor and the at least three reference voltage signals and to selectively output the received signals, sequentially and repeatedly;
at least one analog-to-digital converter configured to receive the selectively outputted signals, sequentially sample each of the selectively outputted signals according to a sampling rate, wherein the sampling rate equals:
(a predetermined sampling rate of the IED) x (1 +the number of reference voltage signals), and
the at least one analog-to-digital converter is further configured to convert each sample to a digital sample; and
at least one processing device configured to calibrate each of the samples of the outputted signal of the at least one sensor based on the samples of the at least three reference voltage signals.

15. The IED of claim 14, wherein the reference source is a voltage reference integrated circuit chip.

16. The IED of claim 14, wherein the at least one analog-to-digital converter is configured to sample the output signals of the at least three reference voltage signals and the at least one output signal of the at least one sensor according to a repeat cycle, the repeat cycle comprising sequentially sampling the output signals of the at least three reference voltage signals each for a first time interval, and then sampling the output signals of the at least one sensor for a second time interval, the second time interval greater than the first time interval.

17. The IED of claim 14, wherein the at least one analog-to-digital converter is configured to sample the output signals of the at least three reference voltage signals and the at least one output signal of the at least one sensor according to a repeat cycle, the repeat cycle comprising sampling the output signals of the at least one sensor and the output signals of the at least three reference signals each for a first time interval.

18. The IED of claim 14, wherein the at least one processing device calibrates the output signals of the at least one sensor based on a gain and an offset determined based on the at least three reference voltage signals.

19. The IED of claim 14, wherein the at least one parameter is one of voltage and current.

20. The IED of in claim 14, wherein the at least one sensor, the reference source, the at least one switch, the at least one analog-to-digital converter and the at least one processing device are configured in at least one of a socket-type meter form, a panel mounted meter form, a switchboard meter form, a A-base front wired meter form and a circuit breaker mounted meter form.

21. An intelligent electronic device (IED) comprising:
at least one sensor configured to measure at least one parameter of an electrical distribution system and output a signal indicative of the measured at least one parameter;
a reference source configured to provide at least two reference voltage signals, each of the at least two reference voltage signals having a different predetermined value;
at least one switch configured to receive the output signal of the at least one sensor and the at least two reference voltage signals and to selectively output the received signals, sequentially and repeatedly;
at least one analog-to-digital converter configured to receive the selectively outputted signals, sequentially sample each of the selectively outputted signals, and convert each sample to a digital sample; and at least one processing device configured to determine a gain based on the samples of the at least two reference voltage signals, wherein the gain is calculated using the following formula:

gain=(a range of a highest reference signal value to the lowest reference signal value)/(highest measured reference signal value−lowest measured reference signal value), and the at least one processing device is further configured to calibrate each of the samples of the outputted signal of the at least one sensor with the gain based on the samples of the at least two reference voltage signals.

22. The IED of claim 21, wherein the reference source is a voltage reference integrated circuit chip.

23. The IED of claim 21, wherein the at least one analog-to-digital converter is configured to sample the output signals of the at least two reference voltage signals and the at least one output signal of the at least one sensor according to a repeat cycle, the repeat cycle comprising sequentially sampling the output signals of the at least two reference voltage signals each for a first time interval, and then sampling the output signals of the at least one sensor for a second time interval, the second time interval greater than the first time interval.

24. The IED of claim 21, wherein the at least one analog-to-digital converter is configured to sample the output signals of the at least two reference voltage signals and the at least one output signal of the at least one sensor according to a repeat cycle, the repeat cycle comprising sampling the output signals of the at least one sensor and the output signals of the at least two reference signals each for a first time interval.

25. The IED of claim 21, wherein the at least one processing device further calibrates the output signals of the at least one sensor based on an offset determined based on the at least two reference voltage signals.

26. The IED of claim 21, wherein the at least one parameter is one of voltage and current.

27. The IED as in claim 21, wherein the at least one sensor, the reference source, the at least one switch, the at least one analog-to-digital converter and the at least one processing device are configured in at least one of a socket-type meter form, a panel mounted meter form, a switchboard meter form, a A-base front wired meter form and a circuit breaker mounted meter form.

28. The IED of claim 21, wherein the predetermined values of the at least two reference voltage signals are 2.0 Volts and a −2.0 Volts.

* * * * *